United States Patent [19]

Weinberg et al.

[11] Patent Number: 4,608,452
[45] Date of Patent: Aug. 26, 1986

[54] LITHIUM COUNTERDOPED SILICON SOLAR CELL

[75] Inventors: Irving Weinberg, Rocky River; Henry W. Brandhorst, Jr., Berea, both of Ohio

[73] Assignee: The United States of America as represented by the Administrator of the National Aeronautics and Space Administration, Washington, D.C.

[21] Appl. No.: 669,140

[22] Filed: Nov. 7, 1984

[51] Int. Cl.$^4$ .................... H01L 31/06; H01L 31/18
[52] U.S. Cl. ...................... 136/261; 29/572; 29/576 B; 148/1.5; 357/30; 357/91
[58] Field of Search ............. 136/261; 29/572, 576 B; 148/1.5; 357/30, 91

[56] References Cited

U.S. PATENT DOCUMENTS 3,471,924 10/1969 Iles ........................................ 29/572
3,490,965 1/1970 Webb .................................. 148/188
4,147,563 4/1979 Narayan et al. ..................... 148/1.5

OTHER PUBLICATIONS

I. Weinberg et al., *Appl. Phys. Lett.*, vol. 44, pp. 1071-1073 (Jun. 1984).

Primary Examiner—Aaron Weisstuch
Attorney, Agent, or Firm—Gene E. Shook; John R. Manning

[57] ABSTRACT

The resistance to radiation damage of an n+p boron doped silicon solar cell is improved by lithium counterdoping. Even though lithium is an n-dopant in silicon, the lithium is introduced in small enough quantities so that the cell base remains p-type.

The lithium is introduced into the solar cell wafer 10 by implantation of lithium ions whose energy is about 50 keV. After this lithium implantation, the wafer is annealed in a nitrogen atmosphere at 375° C. for two hours.

18 Claims, 4 Drawing Figures

LITHIUM COUNTERDOPED SILICON SOLAR CELL

ORIGIN OF THE INVENTION

The invention described herein was made by employees of the United States Government and may be manufactured and used by or for the Government for governmental purposes without the payment of any royalties thereon or therefor.

TECHNICAL FIELD

This invention is concerned with improving a silicon solar cell. The invention is particularly directed to improving the resistance to radiation damage of a silicon solar cell.

It has long been recognized that p-type silicon is innately more radiation damage resistant than n-type silicon. Also most of the radiation damage occurs in the cell's base region.

Lithium is an n-dopant in silicon. Prior art lithium doped p+n silicon solar cells show no improvement in radiation damage resistance over conventional n+p silicon cells when exposed to 1 MeV electron irradiations. Such irradiations are the industry laboratory standard utilized to test solar cells for use in space. It is, therefore, an object of the invention to increase the radiation damage resistance of silicon solar cells over that of conventional n+p boron doped silicon solar cells presently in use to supply electrical power to spacecraft.

It has been found that solar cell performance can be partially restored after radiation damage by annealing. More particularly, the prior art conventional n+p boron doped silicon solar cells require annealing temperatures of 400° C. or higher. At this temperature irreversible damage to solar cell array components occurs. This precludes the possibility of in-situ annealing in space which, if possible, would extend the useful lifetime of solar cell arrays in space. It is, therefore, another object of the invention to reduce the annealing temperature substantially lower than that currently required to restore performance of conventional n+p silicon solar cells.

An additional disadvantage of conventional cells is their tendency to degrade excessively in the particulate radiation environment of space.

BACKGROUND ART

U.S. Pat. No. 3,471,924 to Iles relates to a method of forming a p+n cell. A p+ skin is formed on an n-type or p-type bulk silicon base, and the skin is removed from one side of the base. The exposed bulk silicon is then subjected to vacuum deposition with lithium and heated to a temperature between 350° and 550° C. The lithium causes an n-type silicon base to become highly doped and have a low resistivity. The lithium also causes a p-type base to become very highly doped n-type.

U.S. Pat. No. 3,490,965 to Webb discloses a p-n junction formed by starting with an n-type base, forming a p region by passing boron nitrate vapor over the base at a high temperature, and introducing lithium into the n region by diffusion of a lithium paste applied to the surface of the n region. The wafer is then heated to about 400° C. for about an hour to diffuse the lithium through the entire n region into the p region. The result is a solar cell which is radiation resistant.

U.S. Pat. No. 4,147,563 is concerned with the formation of a p-n junction. The patentee utilizes laser diffusion to accomplish the desired result.

BEST MODE FOR CARRYING OUT THE INVENTION

According to the present invention an n+p silicon solar cell has a boron doped p-type base which is counterdoped with lithium. Even though lithium is an n-dopant in silicon, in the present invention the lithium is introduced in small enough quantities so that the cell base remains p-type.

This lithium counterdoping increases the resistance to radiation damage of the silicon solar cell over that of conventional n+p boron doped silicon solar cells currently used to supply electrical power to spacecraft. Also the annealing temperature is substantially lower than that currently required to restore performance in conventional n+p silicon solar cells.

BRIEF DESCRIPTION OF THE DRAWINGS

The objects, advantages and novel features of the invention will be more fully apparent from the following detailed description when read in connection with the accompanying drawings wherein.

BEST MODE FOR CARRYING OUT THE INVENTION

Figure 1:
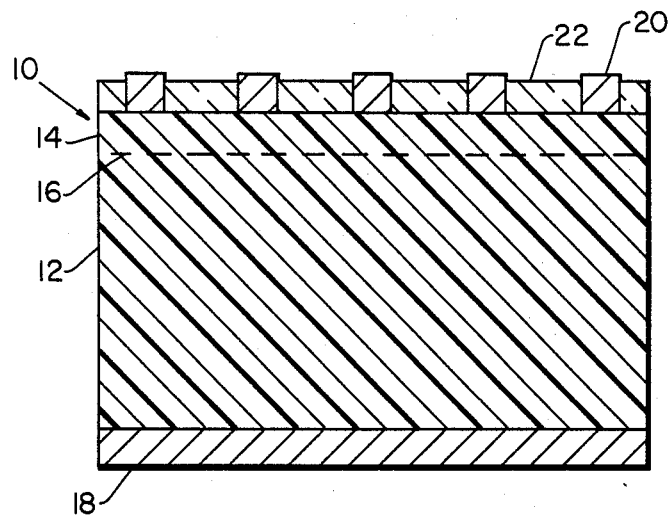
FIG. 1 is an enlarged vertical section view of a lithium counterdoped silicon solar cell constructed in accordance with the present invention.

Referring now to FIG. 1 there is shown an n+p silicon solar cell 10 constructed in accordance with the present invention. The solar cell 10 comprises a silicon wafer having a p-region 12 and an n+ region 14 forming a junction 16.

A rear contact 18 is formed on the surface of the cell 10 which faces away from the light. This rear contact is preferably a titanium-palladium-silver alloy and is formed on the rear surface in a manner well known in the art.

A front contact 20 is formed on the light receiving surface of the cell 10 which is opposite the contact 18. Here again this contact is preferably a titanium-palladium-silver alloy, and the contact is formed in a conventional manner to a gridded configuration.

An antireflection coating 22 covers the light receiving surface of the cell between the portions of the front contact 20. This coating is preferably tantalum pentoxide, or other multiple layer coatings well known in the art.

According to the present invention the n+p silicon solar cell 10 has a p-type base 12 that is doped with both boron and lithium. In contrast to p+n lithium doped cells, the lithium is introduced in small enough quantities such that the cell base remains p-type after the lithium addition.

The starting material for fabricating the cell 10 is p-type boron doped silicon. Resistivities of the starting material range from 1 to 10 ohm-cm with a wafer thickness varying from 50 to 250 micrometers. The lithium is introduced by implantation of lithium ions whose energy is about 50 keV. After this lithium implantation, the wafer is annealed in a nitrogen atmosphere at 375° C. for two hours.

The n+ region 14 is then formed by the implantation of 1O keV phosphorus ions. The lithium concentration in the p region 12 varies between about $10^{14}$ to $10^{15}$ Li/cm$^3$.

After formation of the p-n junction 16 the metallic contacts 18 and 20 are formed. The gridded contact 20 is deposited on the n+ region 14 preferably by vacuum evaporation. The contact 18 is formed on the p region 12 by completely covering the rear surface with the contact metallization. This metallization is of a conventional titanium-palladium-silver combination currently used in conventional n+p silicon solar cells.

After metallization, the antireflection coating 22 is applied to the n+ region 14 as shown in FIG. 1. This tantalum pentoxide or similar coating is applied in a conventional manner.

This process produces an n+p lithium counterdoped silicon solar cell which is more radiation resistant and anneals at a much lower temperature than conventional silicon cells used in space. The added radiation resistance is due to the ability of lithium to form defects which are normally induced in boron-doped silicon by radiation.

Figure 2:
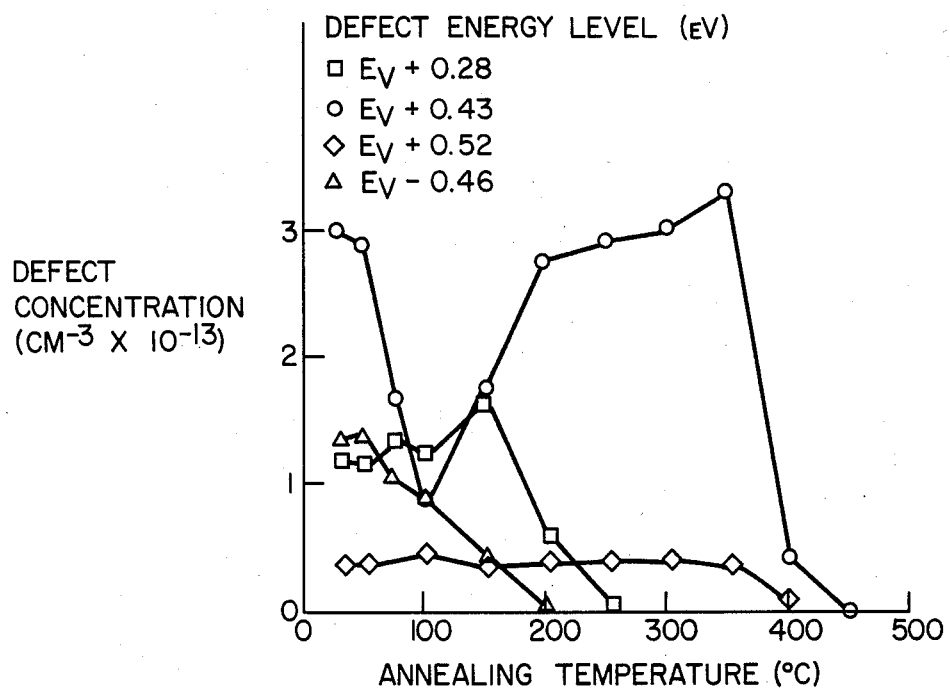
FIG. 2 is a graph showing isochronal anneal of defects in lithium counterdoped silicon solar cells using Deep Level Transient Spectroscopy wherein defect concentration is plotted against annealing temperature.

The reduced annealing temperature is caused by the formation of a major defect in the lithium counterdoped cell whose concentration goes through a minimum at 100° C. This feature is illustrated in FIG. 2 which shows the behavior of the major defects in irradiated lithium counterdoped cells as detected by Deep Level Transient Spectroscopy (DLTS) during an isochronal anneal.

Figure 3:
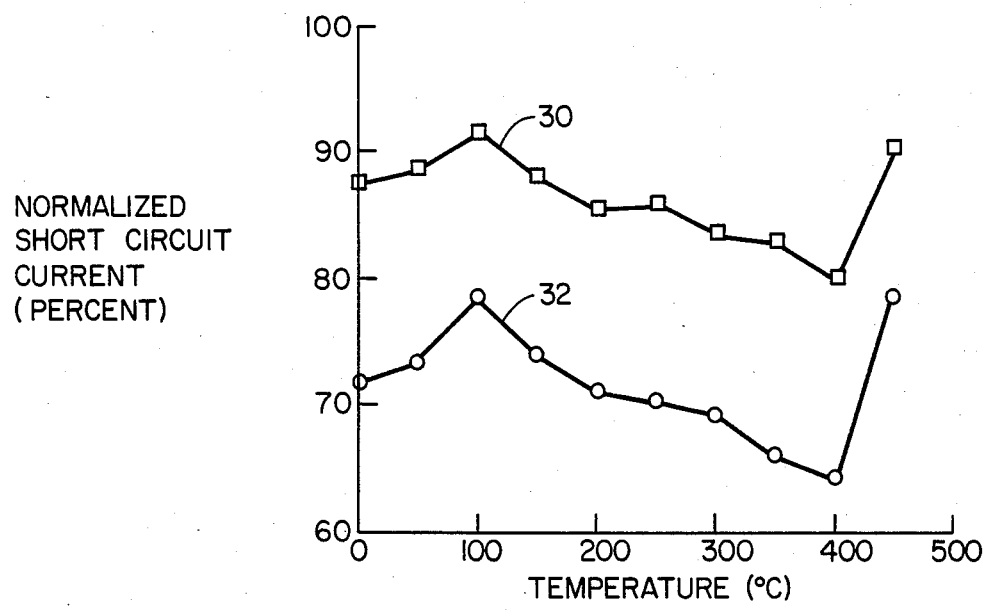
FIG. 3 is a graph showing isochronal anneal of lithium counterdoped silicon solar cells wherein normalized short circuit current is plotted against temperature.

The performance restoration when annealed at 100° C. is illustrated in FIG. 3. The behavior, due to annealing, of short circuit current after irradiation to a 1 MeV electron fluence of $10^{14}$/cm$^2$ is shown by line 30 while the behavior after exposure to a fluence of $10^{15}$/cm$^2$ is shown by line 32.

Figure 4:
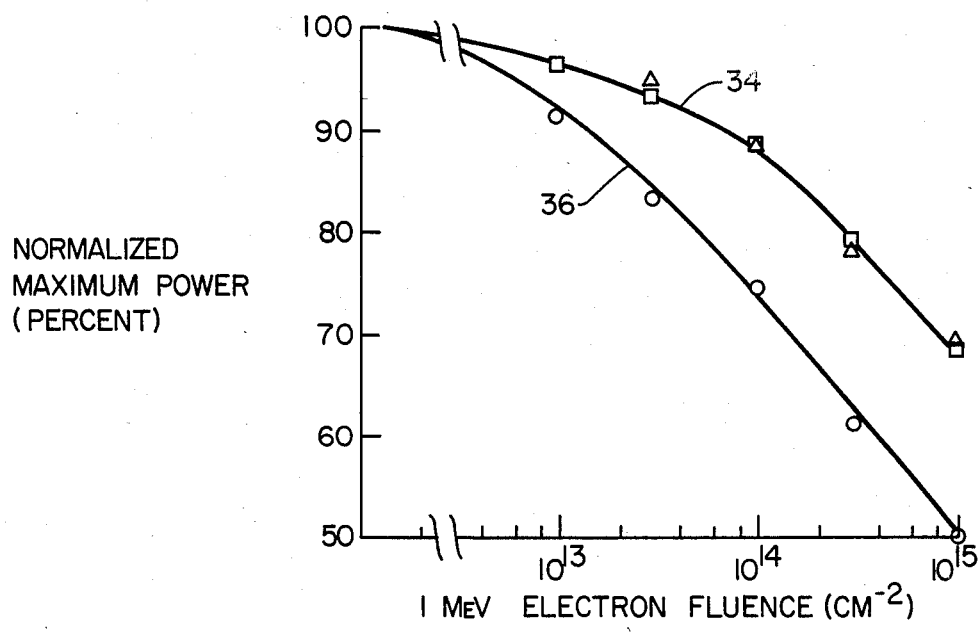
FIG. 4 is a graph showing normalized maximum power plotted against a 1 MeV electron fluence.

That the solar cells produced in accordance with the present invention are more radiation resistant than conventional n+p boron doped silicon cells currently used in space is demonstrated in FIG. 4. More particularly, the lithium counterdoped cells made in accordance with the present invention produce more output power than conventional n+p silicon cells after radiation by 1 MeV electron as shown in FIG. 4 wherein the curve 34 is for the lithium counterdoped cell of the present invention while the curve 36 illustrates a property of a conventional boron-doped control all. It is pertinent to note that prior art p+n lithium doped silicon solar cells show no improvement over conventional n+p silicon solar cells when exposed to 1 MeV electron irradiation.

In addition to possessing increased radiation damage resistance, the lithium counterdoped silicon solar cells of the present invention show significant performance restoration when annealed at a temperature of 100° C. This is illustrated in FIG. 3. In contrast, conventional silicon solar cells now used in space require annealing temperatures of 400° C., or higher, to remove the radiation induced degradation. Components of solar cell arrays, now used in space, such as adhesives, degrade irreversibly at this high temperature. However, this component will not degrade at 100° C. Thus the lithium counterdoped solar cell of the present invention offers in-situ annealing in space, a process which increases the electrical power available from the solar cell array during its use in space missions subject to the degrading particulate environment of space.

While a preferred embodiment of the present invention has been shown and described it will be appreciated that various modifications may be made to the cell without departing from the spirit of invention of the scope of the subjoined claims.

We claim:

1. A method of making a silicon solar cell having improved radiation damage resistance comprising the steps of
   implanting lithium ions in a wafer of p-type boron doped silicon, wherein said lithium is in small enough quantities such that said wafer remains p-type after lithium addition,
   anealing said wafer subsequent to said lithium implantation,
   forming an n+ region adjacent to a surface of said wafer thereby providing a p-n junction, and
   depositing electrical contacts to opposite surfaces of said wafer.

2. A method of making a silicon solar cell as claimed in claim 1 including the step of
   applying an antireflection coating to the surface of said wafer adjacent to said n+ region subsequent to the deposition of said electrical contacts.

3. A method of making a silicon solar cell as claimed in claim 2 wherein the antireflection coating is tantalum pentoxide.

4. A method of making a silicon solar cell as claimed in claim 1 wherein the implanted lithium ions have energies of about 50 keV.

5. A method of making a silicon solar cell as claimed in claim 4 wherein the wafer is annealed in a nitrogen atmosphere subsequent to the lithium implantation.

6. A method of making a silicon solar cell as claimed in claim 5 wherein the wafer is annealed at about 375° C.

7. A method of making a silicon solar cell as claimed in claim 6 wherein the wafer is annealed for about two hours.

8. A method of making a silicon solar cell as claimed in claim 1 wherein the n+ region is formed by the implantation of phosphorus ions.

9. A method of making a silicon solar cell as claimed in claim 8 wherein the implanted phosphorus ions have energies of about 10 keV.

10. A method of making a silicon solar cell as claimed in claim 1 wherein the lithium concentration in the wafer is between about $10^{14}$ Li/cm$^3$ and about $10^{15}$ Li/cm$^3$ after said lithium ion implantation.

11. A method of making a silicon solar cell as claimed in claim 1 wherein the electrical contacts are a titanium-palladium-silver combination.

12. In a method of making a silicon solar cell wherein a wafer of p-type boron doped silicon has an n+ region formed adjacent to a surface by the implantation of phosphorus ions thereby forming a p-n junction, the improvement comprising
   implanting lithium ions in said wafer prior to forming said n+ region, wherein said lithium is in small enough quantities such that said wafer remains p-type after lithium addition thereby improving the radiation damage resistance of said wafer, and anealing said wafer subsequent to said lithium implantation.

13. A method of making a silicon solar cell as claimed in claim 12 wherein the implanted lithium ions have energies of about 50 keV.

14. A method of making a silicon solar cell as claimed in claim 13 wherein the wafer is annealed in a nitrogen atmosphere.

15. A method of making a silicon solar cell as claimed in claim 14 wherein the wafer is annealed at about 375° C.

16. A radiation damage resistant solar cell comprising a wafer of p-type boron doped silicon having lithium ions implanted therein in small enough quantities such that said wafer remains p-type after lithium addition, said wafer having an n+ region formed by phosphorus ions implanted therein adjacent to a surface of said wafer, a first electrical contact on said surface adjacent to said n+ region, and a second electrical contact on an opposite surface of said wafer.

17. A radiation damage resistant solar cell as claimed in claim 16 wherein the lithium concentration in the wafer is between about $10^{14}$ Li/cm$^3$ and about $10^{15}$ Li/cm$^3$.

18. A radiation damage resistant solar cell as claimed in claim 17 including an antireflection coating on the surface of said wafer adjacent to said n+ region.

* * * * *